(12) United States Patent
Hayashi

(10) Patent No.: US 6,178,073 B1
(45) Date of Patent: Jan. 23, 2001

(54) MAGNETO-RESISTANCE EFFECT ELEMENT WITH A FIXING LAYER FORMED FROM A SUPERLATTICE OF AT LEAST TWO DIFFERENT MATERIALS AND PRODUCTION METHOD OF THE SAME

(75) Inventor: Kazuhiko Hayashi, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/196,219

(22) Filed: Nov. 20, 1998

(30) Foreign Application Priority Data

Dec. 1, 1997 (JP) .................................................. 9-330499

(51) Int. Cl.[7] ........................................................ G11B 5/39
(52) U.S. Cl. .......................................................... 360/324.11
(58) Field of Search ................................ 360/113, 324.11, 360/324.1; 338/32 R; 324/252; 427/548

(56) References Cited

U.S. PATENT DOCUMENTS

| 5,552,949 | * | 9/1996 | Hashimoto et al. | 360/113 |
| 5,576,915 | * | 11/1996 | Akiyama et al. | 360/113 |
| 5,859,754 | * | 1/1999 | Tong et al. | 360/113 |
| 5,872,502 | * | 2/1999 | Fujikata et al. | 338/32 R |
| 6,001,430 | * | 12/1999 | Fujikata et al. | 427/548 |

FOREIGN PATENT DOCUMENTS

| 2-61572 | 3/1990 | (JP) . |
| 4-358310 | 12/1992 | (JP) . |
| 6-203340 | 7/1994 | (JP) . |
| 6-214837 | 8/1994 | (JP) . |
| 7-136670 | 5/1995 | (JP) . |
| 7-202292 | 8/1995 | (JP) . |
| 7-262529 | 10/1995 | (JP) . |
| 8-127864 | 5/1996 | (JP) . |
| 8-138935 | 5/1996 | (JP) . |
| 8-204253 | * 8/1996 | (JP) . |
| 9-50612 | 2/1997 | (JP) . |
| 9-83039 | 3/1997 | (JP) . |
| 10-32119 | 2/1998 | (JP) . |

OTHER PUBLICATIONS

Nikkei Electronics, No., 655, p. 16, Feb. 12, 1996.

Thompson, et al., "Thin Film Magnetoresistors in Memory, Storage, and Related Applications", Jul. 1975, pp. 1039–1050, *IEEE Transactions of Magnetics*, vol. MAG-11.

* cited by examiner

*Primary Examiner*—Jefferson Evans
(74) *Attorney, Agent, or Firm*—Young & Thompson

(57) ABSTRACT

A magneto-resistance (MR) effect element in which a temperature causing rotation of the magnetization direction can be adjusted by controlling a thickness of a layer constituting a superlattice of a magnetization-fixing layer made from a combination of a metal antiferromagnetic layer and/or a ferrimagnetic layer.

12 Claims, 4 Drawing Sheets

MAGNETO-RESISTANCE EFFECT ELEMENT WITH A FIXING LAYER FORMED FROM A SUPERLATTICE OF AT LEAST TWO DIFFERENT MATERIALS AND PRODUCTION METHOD OF THE SAME

BACKGROUND OF THE INVENTION

1. Field of the Invention

The present invention relates to a magneto-resistance effect element for reading an information signal recorded on a magnetic recording medium as well as to a magneto-resistance effect sensor, a magneto-resistance effect detection system, and a magnetic storage system using the magneto-resistance effect element.

2. Description of the Related Art

Conventionally, a magnetic reading converter is known with a name of an MR sensor or an MR head. It is known that data can be read from a magnetic surface with a large linear density. The MR sensor detects a magnetic field signal via a resistance change as a function of an intensity and a direction of the magnetic flux sensed by a reading element. Such an MR sensor of a conventional technique operates according to an anistoropic magneto-resistance (AMR) effect in which a resistance component of a reading element changes in proportion to the square of a cosine of an angle between a magnetization direction and a sensing current flowing in the element. A more detailed explanation on the AMR effect is given in D. A. Thomson et al, "Memory, Storage and Related Applications" IEEE Trans. On Mag. MAG-11, p. 1039 (1975). In a magnetic head using the AMR effect, a longitudenal bias is usually applied so as to suppress the Barkhausen noise. This longitudinal bias is applied, for example, by using an antiferromagnetic material such as FeMn, NiMn, and a nickel oxide.

Furthermore, recent publications describe a more remarkable magneto-resistance effect in which a resistance change of a layered magnetic sensor attributes to a conductive electron spin-dependant transmission between magnetic layers via a non-magnetic layer accompanied by a spin-dependant scattering on the layer boundary surface. This magneto-resistance effect is called with various names such as "giant magneto-resistance effect" and "spin bulb effect". Such an MR sensor is made from an appropriate material and exhibits an improved sensitivity and a greater resistance change than a sensor using the AMR effect. In this type of MR sensor, an in-plane resistance between a pair of ferromagnetic layers isolated by a non-magnetic layer changes in proportion to a cosine of an angle defined by the magnetization directions of the two layers.

Japanese Patent Publication (Unexamined) No. A-02-61572 associated with a priority date in June, 1988 [1] discloses a layered magnetic configuration that brings about a high MR change generated by anti-parallel arrangement of magnetization within magnetic layers. Document [1] describes ferromagnetic transition metals and alloys as materials that can be used for the layered configuration. Moreover, Document [1] discloses a configuration in which an antiferromagnetic layer is added to at least one of two ferromagnetic layers isolated by an intermediate layer and that the antiferromagnetic layer is preferably made from FeMn.

Japanese Patent Publication (Unexamined) No. A-04-358310 associated with a priority date of Dec. 11, 1990 [2] discloses an MR sensor having two ferromagnetic thin film layers isolated by a non-magnetic metal thin film layer, in which MR sensor when the magnetic field applied is 0, the two ferromagnetic thin film layers have magnetization directions vertically intersecting each other and the resistance between the two ferromagnetic layers not connected changes in proportion to a cosine of an angle defined by the magnetization directions of the two layers independently of a current flowing in the sensor.

Japanese Patent Publication (Unexamined) No. A-06-203340 associated with a priority date of Aug. 28, 1992 [3] discloses an MR sensor based on the aforementioned effect and having two ferromagnetic thin film layers isolated by a non-magnetic metal thin film layer, in which MR sensor when an external magnetic field applied is zero, magnetization of an antiferromagnetic layer adjacent to one of ferromagnetic layers is kept vertical to the other ferromagnetic layer.

Japanese Patent Publication (Unexamined) No. A-07-262529 filed on Mar. 24, 1994 [4] discloses a magneto-resistance effect element as a pin bulb having a layered configuration of a first magnetic layer, a non-magnetic layer, a second magnetic layer, and an antiferromagnetic layer, the first and second magnetic layers using CoZrNb, CoZrMo, FeSiAl, FeSi, or NiFe materials, which may also contain Cr, Mn, Pt, Ni, Cuy, Ag, Al, Ti, Fe, Co, and Zn.

Japanese Patent Publication (Unexamined) No. A-07-202292 filed on Dec. 27, 1993 [5] discloses a magneto-resistance effect film having a plurality of magnetic thin films layered via a non-magnetic layer on a substrate and an antiferromagnetic thin film provided adjacent to one of soft magnetic thin films separated by a non-magnetic thin film, wherein the antiferromagnetic thin film has a bias magnetic field of Hr greater than a coercive force Hc2 of the other soft magnetic thin film, and the antiferromagnetic film is made from at least one of, or a mixture of NiO, CoO, FeO, $Fe_2O_3$, MnO, and Cr. Moreover, Japanese Patent Application No. 06-214837 filed on Sep. 8, 1994 [6] and Japanese Patent Publication (Unexamined) No. A-08-127864 filed on Nov. 2, 1994 [7] disclose a magneto-resistance effect film, wherein the aforementioned antiferromagnetic film is a superlattice made from at least two materials selected from a group consisting of NiO, NixCo1-xO, and CoO.

Furthermore, Japanese Patent Publication (Unexamined) No.A-08-204253 filed on Jan. 27, 1995 [8] discloses a magneto-resistance effect film characterized in that the aforementioned antiferromagnetic film is a superlattice made from at least two materials selected from a group consisting of NiO, NixCo1-xO (wherein x=0.1 to 0.9), and CoO, and that the atomic number ratio of Ni against Co in the superlattice is 1.0 or above. Moreover, Japanese Patent Application No. 07-136670 [9] discloses a magneto-resistance effect film characterized in that the aforementioned antiferromagentic film is a two-layered film made from 10 to 40 Angstrom of CoO formed on a NiO layer.

When actually mounting a magneto-resistance (hereinafter, referred to as MR) effect element on a recording/reproduction head, various thermal treatments are required after the MR effect element is formed, including a photo-resist hardening step for forming a recording head block. However, in a case of the spin bulb type MR effect element, magnetization of the antiferromagnetic layer is rotated by a thermal treatment and the spin bulb may not operate normally as an MR effect element. To cope with this, after forming a recording head block and a reproduction head block, the magnetization direction of the antiferromagnetic layer needs be corrected. However, if the temperature applied in this correction treatment is too high, the following two problems arise.

If a spin bulb type MR effect element is to have little hysteresis, i.e., little noise as a reproduction head in the magnetic field dependency characteristic, it is necessary to lower a coercive force of a free magnetic layer. For this, it is effective to maintain the magnetization axis direction of the free magnetic layer almost vertical against the magnetization direction of the antiferromagnetic layer. However, the direction of the magnetic field applied for correcting the magnetization of the antiferromagnetic layer is vertical to the axis of easy magnetization. Accordingly, if the treatment temperature is too high, the axis of easy magnetization of the free magnetic layer becomes almost parallel to the magnetization direction of antiferromagentic layer, deteriorating the noise characteristic of the reproduction head. Moreover, if the spin bulb is subjected to a thermal treatment of a high temperature, the non-magnetic layer may be dispersed into the magnetic layers, which in turn decreases the resistance change ratio, lowering the output of the reproduction head.

On the other hand, when using a material enabling to correct the magnetization of the antiferromagnetic layer at a lower temperature, the magnetization of the antiferromagnetic layer is rotated by an external magnetic field even with an operation environment temperature of a hard disc apparatus. That is, it becomes difficult to assure high reliability. From a viewpoint of an optimal spin bulb material design including a production procedure of the recording/reproduction head, it becomes important to be able to change the temperature at which the magnetization of the antifeerromagnetic layer is rotated, i.e., to be able to change a thermal treatment temperature for the aforementioned correction of the magnetization direction.

SUMMARY OF THE INVENTION

It is therefore an object of the present invention to provide a magneto-resistance (MR) effect element in which a temperature causing rotation of the magnetization direction can be adjusted.

Another object of the present invention is to provide an magneto-resistance effect head, a magneto-resistance detection system, and a magnetic storage system employing the aforementioned MR effect element.

In order the achieve the aforementioned objects, the present invention provides a magneto-resistance (MR) effect element having a multi-film basic configuration of a unit consisting of a free magnetic layer, a non-magnetic layer, a fixed magnetic layer, and a magnetization-fixing layer, or a unit consisting of a magnetization-fixing layer, a fixed magnetic layer, a non-magnetic layer, and a free magnetic layer, wherein the magnetization-fixing layer is made from a superlattice of a metal antiferromagnetic layer or a metal ferrimagnetic layer consisting of at least two different materials.

In a superlattice made from at least two different materials, respective layers are connected to each other through superexchange interaction, exhibiting an exchange interaction characteristic similar to that of a single layer. However, the exchange interaction magnetic field and the temperature causing rotation of a magnetization direction vary depending on the characteristics and film thickness of the respective layers as well as the film thickness ratio between the layers.

FIG. 1 shows a relationship between a magnetization-enabled temperature and a film thickness ratio between two types of antiferromagnetic materials constituting a superlattice. These two antiferromagnetic materials have different thermal treatment temperature values at which magnetization of a magnetization-fixing layer can be orientated in a single direction by way or rotation. As the film thickness ratio changes, the magnetization-enabled temperature is also changed continuously.

In a case when two or more types of materials are used as a mixture without forming a superlattice, it is observed that the exchange interaction does not vary continuously according to the mixture ratio. It is also observed that no exchange interaction occurs at a certain mixture ratio of particular materials. In most antiferromagnetic materials and ferrimagnetic materials, a regular structure or amorphous structure is required to exhibit their magnetic characteristic. Accordingly, the film composition need be within a certain range that is not very wide. In a case of a simple mixture, there is a possibility that when the mixture is out of the composition range a completely different structure may be formed which results in a completely different magnetic characteristic. On the contrary, in the case of superlattice, the optimal composition is maintained inside each layer, retaining the magnetic characteristic based on the composition and structure.

DESCRIPTION OF THE PREFERRED EMBODIMENTS

Figure 1:
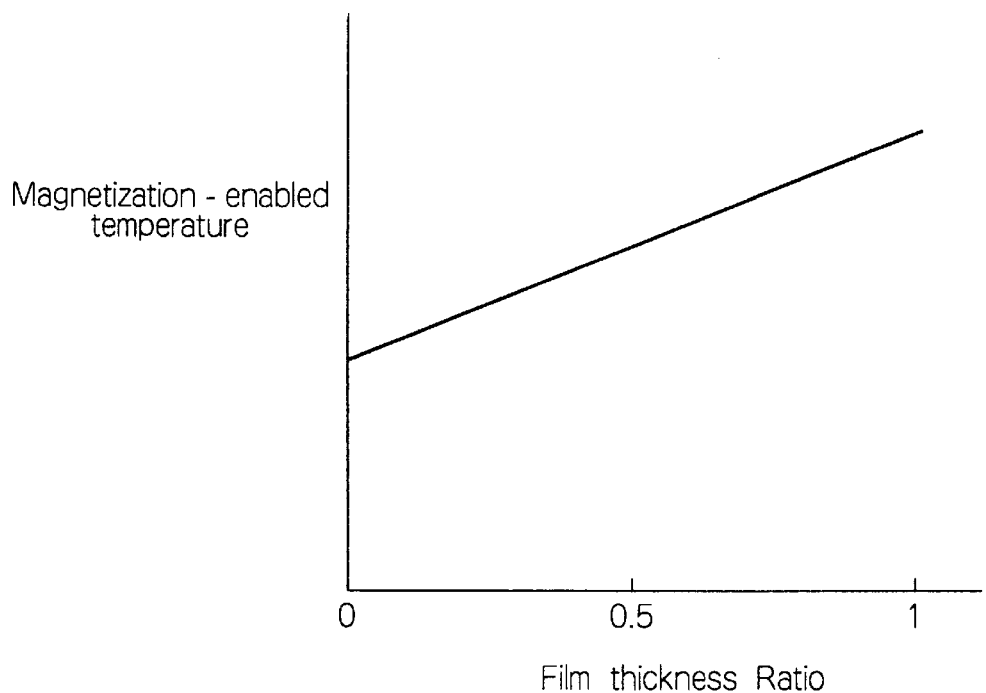
FIG. 1 shows a relationship between a film thickness ratio and a magnetization-enabled temperature.
Figure 2:
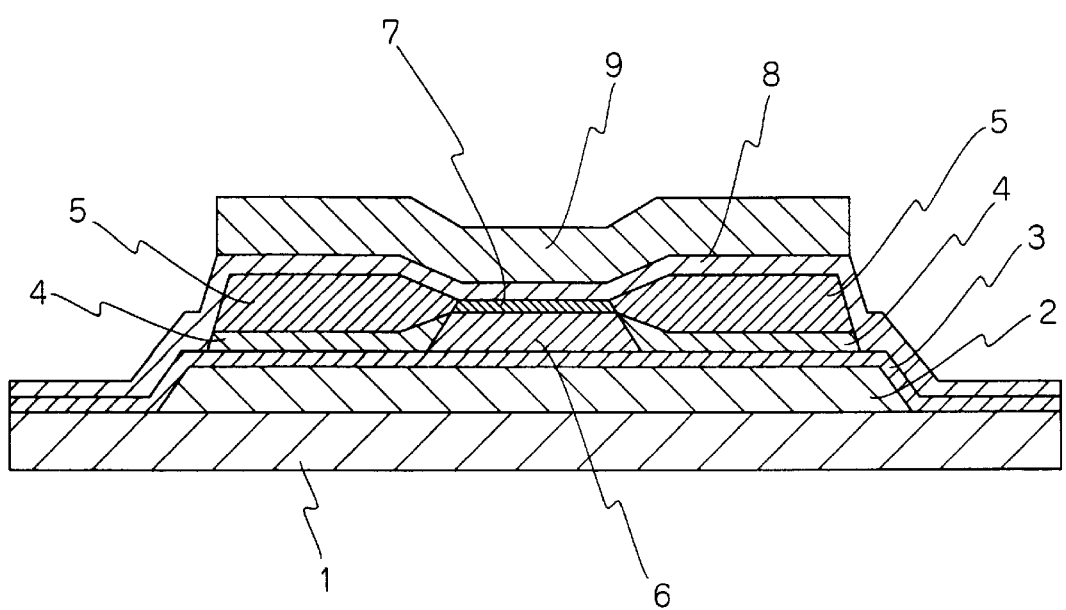
FIG. 2 shows a typical configuration of a shield type MR sensor.
Figure 3:
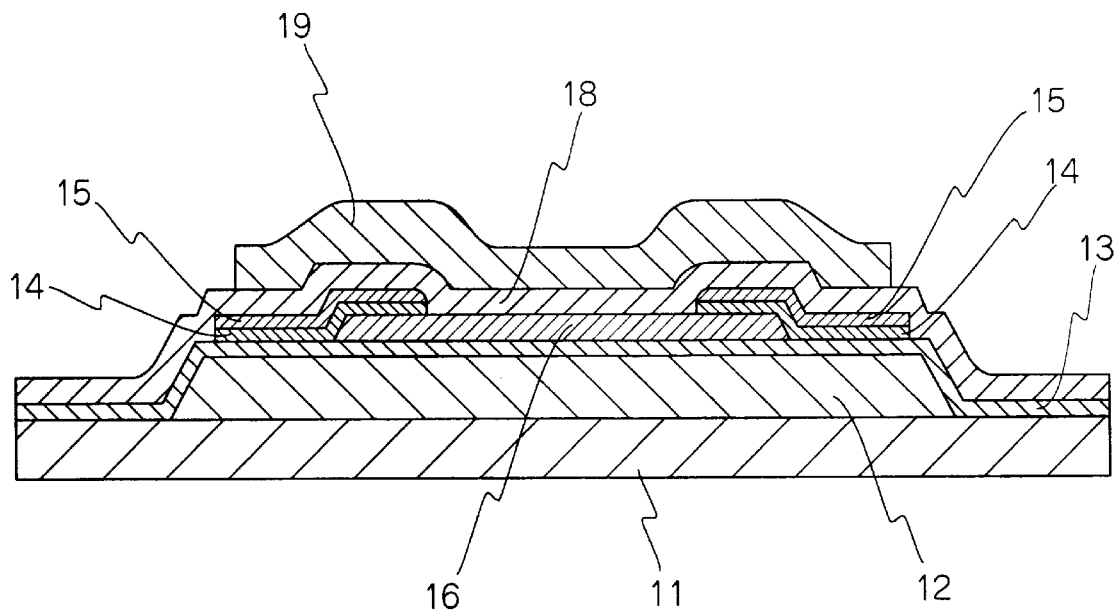
FIG. 3 shows another typical configuration of a shield type MR sensor.

The present invention may be used in various configurations of magneto-resistance (MR) sensors, such as those shown in FIG. 2 and FIG. 3.

In the MR sensor of FIG. 2, on a substrate 1 are formed a lower shield layer 2, a lower gap layer 3, and a magneto-resistance effect element 6, which may be covered with a gap regulating insulation layer 7. The lower shield layer 2 is often patterned into an appropriate size by a photo-resist (PR) step. The magneto-resistance (MR) effect element 6 is patterned into an appropriate size and configuration by a photo-resist step. Adjacent to the ends of the MR effect element 6, a longitudinal bias layer 4 and a lower electrode layer 5 are successively formed in this order. On the lower electrode layer 5, an upper gap layer 8 and an upper shield layer 9 are successively formed.

In the MR sensor of FIG. 3, on a substrate 11 are formed a lower shield layer 12, a lower gap layer 13, and a magneto-resistance (MR) effect element 16. The lower shield layer 12 is often patterned into an appropriate size by a photo-resist step. The magneto-resistance (MR) effect element 16 is patterned into an appropriate size and configuration by a photo-resist step. The MR effect element 6 is partially covered by a longitudinal bias layer 14 and a lower electrode layer 15 formed successively in this order. After this, an upper gap layer 18 and an upper shield layer 19 are successively formed in this order.

The lower shield layer 2, 12 of FIG. 2 and FIG. 3 may be made from NiFe, CoZr, CoFeB, CoZrMo, CoZr, CoZrTa, CoHf, CoTa, CoTaHf, CoNbHf, CoHfPd, CoTaZrNb, CoZrMoNi alloys, FeAlSi, iron nitrides with a film thickness in a range from 0.3 to 10 micrometers. The lower gap layer 3, 13 may be made from alumina, $SiO_2$, aluminium nitride, silicon nitride, diamond-like carbon and the like, with a film thickness preferably in a range from 0.01 to 0.20 micrometers. The lower electrode layer 5, 15 is preferably made from Zr, Tz, and Mo as a single material or alloy or a mixture with a film thickness preferably in a range from 0.01 to 0.10 micrometers.

The longitudinal bias layer 4, 14 may be made from a mixture of CoCrPt, CoCr, CoCrTa, FeMn, NiMn, PtPdMn, ReMn, PtMn, CrMn, Ni oxide, irorn oxide, Ni oxide in combination with a co oxide, a mixture of Ni oxide of Fe oxide, a two-layered film of Ni oxide/Co oxide, two-layered film of Ni oxide/Fe oxide, and the like. The gap regulating insulation layer 7 may be made from alumina $SiO_2$, aluminium nitride, silicon nitride, diamond-like carbon and the like, with a film thickness preferably in a range from 0.005 to 0.05 micrometers.

The upper gap layer 8, 18 may be made from alumina, $SiO_2$, aluminium nitride, silicon nitride, diamond-like carbon and the like preferably with a film thickness in a range from 0.01 to 0.20 micrometers. The upper shield layer 9, 19 may be made from NiFe, CoZr, or CoFeB, CoZrMo, CoZrNb, CoZr, CoZrTa, CoHf, CoTa, CoTaHf, CoNbHf, CoZrNb, CoHfPd, CoTaZrNb, CoZrMoNi alloys, FeAlSi, iron nitrides with a film thickness in a range from 0.3 to 10 micrometers.

These shield-type elements can be formed into a unitary recording/reproduction head by forming a write-in head block using an inbductive coil.

Figure 4:
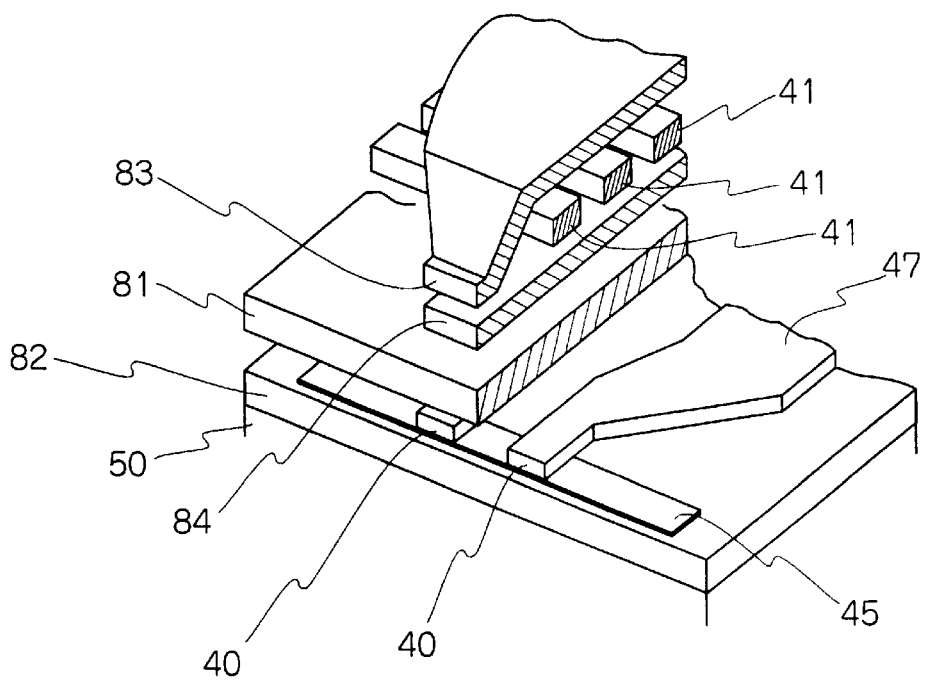
FIG. 4 shows a conceptual configuration of a recording/reproduction head.

FIG. 4 is a conceptual configuration of such a recording/reproduction head. The recording/reproduction head consists of a reproduction head using the MR element according to the present invention and an inductive-type recording head. In this example, a longitudinal magnetic recording head is mounted. However, the magneto-resistance (MR) effect element according to the present invention may also be employed in combination with a vertical magnetic recording head for vertical recording. The recording/reproduction head comprises a reproduction head block including a lower shield film 82 formed on a substrate 50, a magneto-resistance (MR) effect film 10, an electrode 40, and an upper shield film 81; and a recording head block including a lower magnetic film 84, a coil 41, and an upper magnetic film 83. Here, the upper shield film 81 and the lower magnetic film 84 may share a single member. This recording/reproduction head is capable of writing a signal on a recording medium and reads out a signal from the recording medium. Thus, the reproduction head block has a sensing portion formed on a single slider with the magnetic gap of the recording head block. This permits simultaneous positioning on a single track. This recording/reproduction head placed on a slider is mounted on a magnetic recording/reproduction apparatus.

Figure 5:
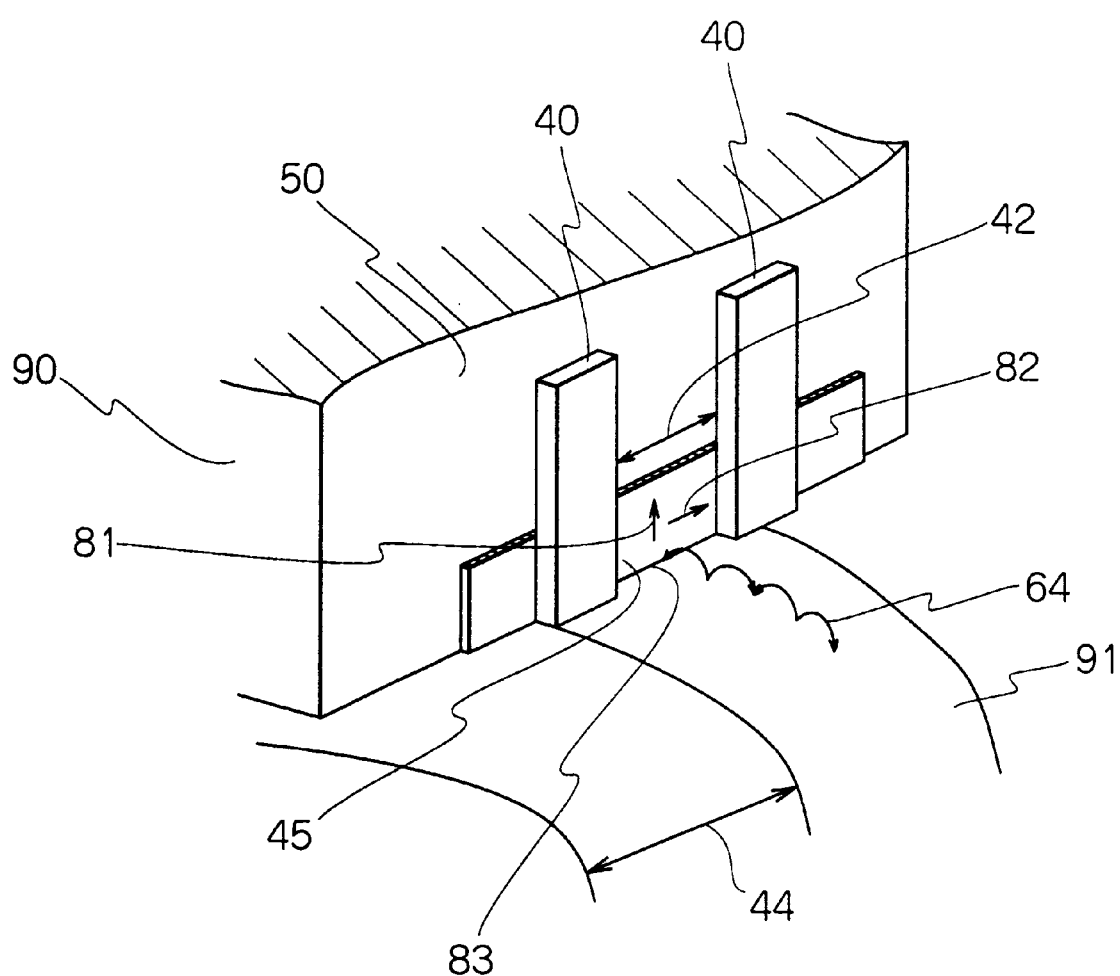
FIG. 5 shows a conceptual configuration of a magnetic recording/reproducing apparatus.

FIG. 5 is a conceptual configuration of a magnetic recording/reproducing apparatus using the magneto-resistance effect element according to the present invention. A magneto-resistance (MR) effect film 45 and an electrode film 40 are formed on a substrate 50 serving also as a head slider 90, which is positioned on a recording medium 91 for performing a reproduction. While the recording medium 91 is rotated, the head slider 91 performs a relative movement at a height of 0.2 micrometers or below from the recording medium 91 or in contact with the recording medium 91. This mechanism enables the magneto-resistance effect film 45 to be positioned for reading a magnetic signal recorded on the recording medium 91 through a leak magnetic field.

FIG. 6A to FIG. 6H show conceptual examples of film configuration of the magneto-resistance effect element used in the present invention.

Figure 6:
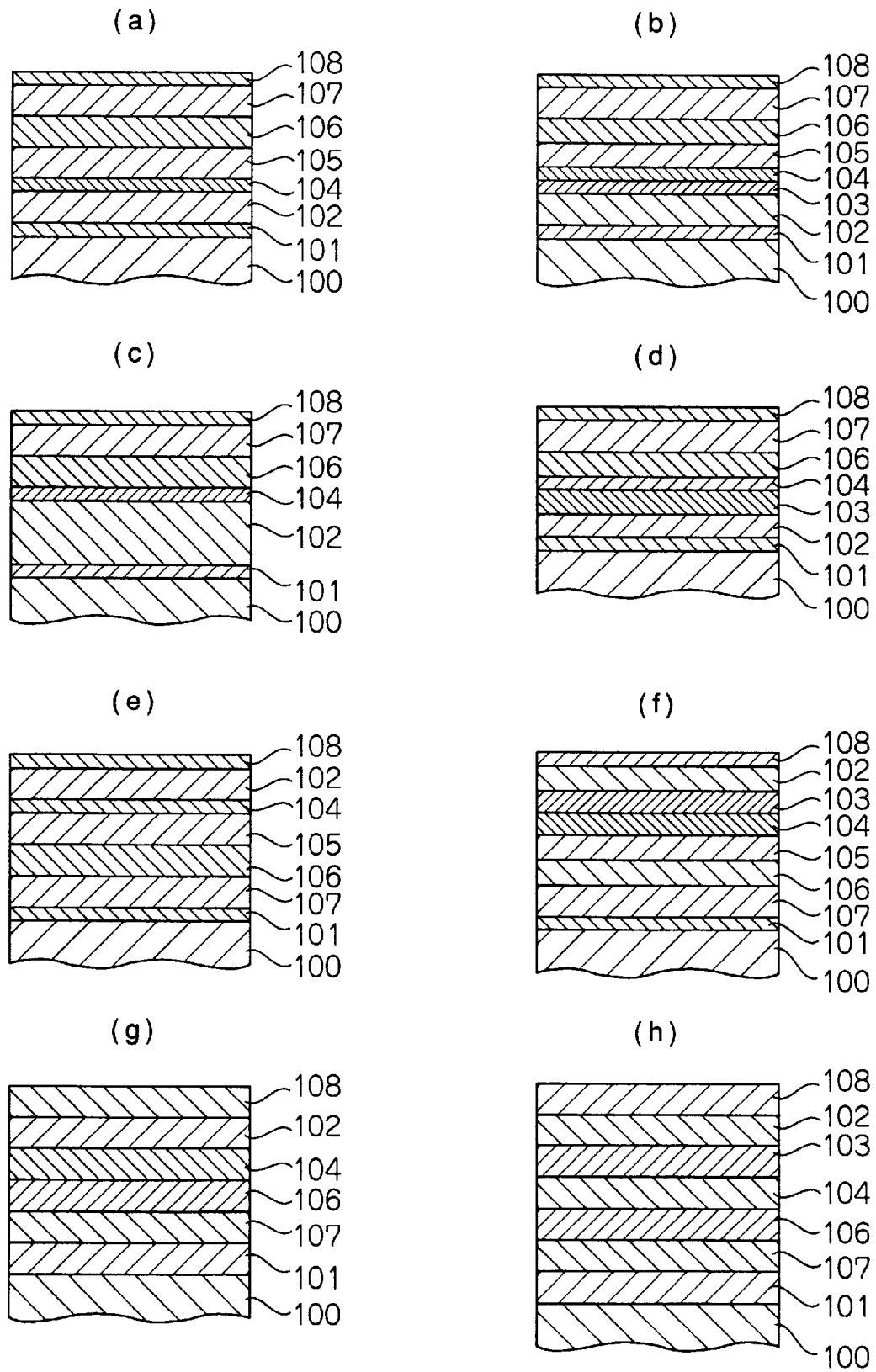
FIG. 6 shows eight examples of (A to H) of a typical configuration of a magneto-resistance (MR) effect element.

FIG. 6A shows a layered configuration formed on a substrate 100 including an undercoating layer 101, a first free layer 102, a non-magnetic layer 104, an MR enhance layer 105, a fixed magnetic layer 106, an antiferromagnetic layer 107, and a protection layer 108 successively formed in this order.

FIG. 6B shows a layered configuration formed on a substrate 100 including an undercoating layer 101, a first free layer 102, a second free layer 103, a non-magnetic layer 104, an MR enhance layer 105, a fixed magnetic layer 106, an antiferromagnetic layer 107, and a protection layer 108 successively formed in this order.

FIG. 6C shows a layered configuration formed on a substrate 100 including an undercoating layer 101, a first free layer 102, a non-magnetic layer 104, a fixed magnetic layer 106, an antiferromagnetic layer 107, and a protection layer 108 successively formed in this order.

FIG. 6D shows a layered configuration formed on a substrate 100 including an undercoating layer 101, an antiferromagnetic layer 107, a fixed magnetic layer 106, a non-magnetic layer 104, a second free layer 103, a first free layer 102, and a protection layer 108 successively formed in this order.

FIG. 6E shows a layered configuration formed on a substrate 100 including an undercoating layer 101, an antiferromagnetic layer 107, a fixed magnetic layer 106, an MR enhance layer 105, a non-magnetic layer 104, a first free layer 102, and a protection layer 108 successively formed in this order.

FIG. 6F shows a layered configuration formed on a substrate 100 including an undercoating layer 101, an antiferromagnetic layer 107, a fixed magnetic layer 106, a non-magnetic layer 104, a second free layer 103, a first free layer 102, and a protection layer 108 successively formed in this order.

FIG. 6G shows a layered configuration formed on a substrate 100 including an undercoating layer 101, an antiferromagnetic layer 107, a fixed magnetic layer 106, a non-magnetic layer 104, a first free layer 102, and a protection layer 108 successively formed in this order.

FIG. 6H shows a layered configuration formed on a substrate 100 including an undercoating layer 101, an antiferromagnetic layer 107, a fixed magnetic layer 106, a non-magnetic layer 104, a second free layer 103, a first free layer 102, and a protection layer 108 successively formed in this order.

The undercoating layer 101 may be a single-layered film made from at least one metals, a mixture film, a multi-layered film. More specifically, the single-layered film, mixture film, or multi-layered film are made from Ta, Hf, W, Cr, Ti, Mo, Pt, Ni, Ir, Cu, Ag, Co, Zn, Ru, Rh, Re, Au, Os, Pd, Nb, and V. The first free layer 102 and the second free layer 103 may be formed using NiFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, CoZrMoNi alloys or amorphous magnetic material with a film thickness preferably in a range from 1 to 10 nm.

The non-magnetic layer 104 is preferably made from a Cu material, a Cu material with addition of 1 to 20 at % of Ag, or a Cu material with addition of 1 to 20 at % of Re, or a Cu—Au alloy, with a film thickness of 2 to 4 nm.

The MR enhance layer 105 is made from Co, NiFeCo, FeCo and the like, or CoFeB, CoZrMo, CoZrNb, CoZr, CoZrTa, CoHf, CoTa, CoTaHf, CoNbHf, CoZrNb, CoHfPd, CoTaZrNb, CoZrMoNi alloys or amorphous magnetic materials, with a film thickness preferably in a range from 0.5 to 5 nm. When the MR enhance layer is not used, the MR ratio is slightly lowered than when the MR enhance layer is used. However, omission of the MR enhance layer also results in a reduction of the number of production steps.

The fixed magnetic layer 106 may be a single material, alloy, or a layered film using Co, Ni, Fe as a base material, with a film thickness preferably in a range from 1 to 50 nm.

The protection layer 108 may be made from a metal, oxide, nitride, oxide in combination with a nitride or a two-layered film of metal/oxide, or two-layered film of metal/(mixture of oxide and nitride). The typical two-layered film is made by using a simple substance or mixture of oxides and nitrides of Ti, V, Cr, Co, Cu, Zn, Y, Zr, Nb, Mo, Tc, Ru, Rh, Pd, Ag, Hf, Ta, W, Re, Os, Ir, PT, Au or Si, Al, Ti, Ta in combination with a single substance or an alloy containing at least one element selected from a group consisting of Ta, Hf, Zr, W, Cr, Ti, Mo, Pt, Ni, IR, Cu, Ag, Co, Zn, Ru, Rh, Re, Au, Os, Pd, Nb, V, Y.

EXAMPLES

Firstly, a magneto-resistance effect element was prepared by using a single-layered film of FeMn, PtMn, TbCo, TbFeCo, and NiMn and their charactristics were evaluated. The film configuration is as follows: a glass substrate, Ta (3 nm), NiFe (6 nm), Cu (2.7 nm), CoFe (2 nm), NiFe (1 nm), a magnetization-fixing layer, Ta (3 nm). The film formation was performed by using a magnetron sputter apparatus with a back pressure set to $5 \times 10^{-9}$. The magneto-resistance effect elements obtained were examined in the resistance change ratio, exchange interaction magnetic field, and magnetization-enabled temperature defined below.

Resistance change ratio: (maximum resistance value−minimum resistance value)/minimum resistance value×100.

Exchange interaction magnetic field: Exchange interaction magnetic field (Oe) applied to a fixed layer from a magnetization-fixing layer at a room temperature.

Magnetization-enabled temperature: A magnetic field of 500 Oe was applied in a direction opposite to the magnetization direction of the fixed layer not subjected to any ambient magnetic field, in a vacuum of $5 \times 10^{-7}$ Torr for 5 hours. In this condition, a temperature was increased while observing a magnetization curve by the VSM (vibrating sample magnet) to determine a temperature, i.e., magnetization-enabled temperature, when the magnetization of the fixed layer was aligned in a single direction different from the initial state of the magnetization of the fixed layer (that is, the magnetization of the magnetization-fixing layer was aligned in one direction different from the initial state).

| Magnetization-fixing layer | MR ratio (%) | Hex (Oe) | Magnetization-enabled temperature |
|---|---|---|---|
| Fe50Mn50 (10 nm) | 7.0 | 430 | 120 |
| Pt50OmnS0 (30 nm) | 5.1 | 520 | 190 |

-continued

| Magnetization-fixing layer | MR ratio (%) | Hex (Oe) | Magnetization-enabled temperature |
|---|---|---|---|
| Ir20mn80 (30 nm) | 6.2 | 460 | 170 |
| Ni50mn50 (30 nm) | 4.3 | 660 | 220 |
| Tb28Co72 (8 nm) | 7.5 | 480 | 130 |
| Tb30Fe30Co40 (8 nm) | 7.7 | 490 | 130 |

Example A1

Next, in a configuration including a glass substrate, Ta (3 nm), NiFe (6 nm), Cu (2.7 nm), CoFe (2 nm), NiFe (1 nm), a magnetization-fixing layer, and Ta (3 nm), a superlattice of Ni50Mn50 and Fe50Mn50 was used for the magnetization-fixing layer. The FeMn layer was formed to be in contact with the fixed magnetic layer. The magnetization-fixing layer was set to have an entire film thickness of 30 nm. The NiMn layer and the FeMn layer were set to have a total film thickness of 3 nm. Table 1 shows an exchange interaction magnetic field according to a change of the NiMn film thickness ratio=(NiMn layer thickness)/(total thickness of NiMn layer and FeMn layer). Table 2 shows a magnetization-enabled temperature according to the change of the NiMn film thickness. The exchange interaction magnetic field and the magnetization-enabled temperature were increased almost continuously as the NiMn film thickness ratio increased. Table 3 and Table 4 show the exchange interaction magnetic field and the magnetization-enabled temperature, respectively, when the NiMn film thickness ratio was fixed to 0.5 while changing the total thickness of the NiMn layer and the FeMn layer. The exchange interaction magnetic field and the magnetization-enabled temperature were almost constant when the total film thickness was 5 nm or below, but they were decreased, exhibiting values near to the values of a single-layered FeMn when the total thickness exceeded 5 nm. It is considered that as the film thickness per layer increases, the affect from the FeMn layer in a direct contact with the fixed layer also increases.

TABLE 1

NiMn film thickness ratio in relation to the exchange interaction magnetic field
NiMn film thickness ratio = (NiMn layer thickness)/(total thickness of NiMn layer and FeMn layer)

| NiMn film thickness ratio | Exchange interaction magnetic field (Oe) |
|---|---|
| 0 | 430 |
| 0.3 | 550 |
| 0.5 | 540 |
| 0.7 | 630 |
| 1 | 660 |

TABLE 2

NiMn film thickness ratio in relation to
magnetization-enabled temperature

| NiMn film thickness ratio | Magnetization-enabled temperature (° C.) |
|---|---|
| 0 | 120 |
| 0.3 | 140 |
| 0.5 | 172 |
| 0.7 | 193 |
| 1 | 220 |

TABLE 3

Total film thickness in relation to
Exchange interaction magnetic field
Total film thickness = Total of NiMn layer and FeMn layer

| Total film thickness (nm) | Exchange interaction magnetic field (Oe) |
|---|---|
| 0.2 | 550 |
| 0.3 | 570 |
| 0.5 | 540 |
| 0.7 | 470 |
| 0.8 | 430 |
| 1 | 420 |

TABLE 4

Total film thickness in relation to
Magnetization-enabled temperature

| Total film thickness (nm) | Magnetization-enabled temperature (° C.) |
|---|---|
| 0.2 | 172 |
| 0.3 | 172 |
| 0.5 | 170 |
| 0.7 | 150 |
| 0.8 | 134 |
| 1 | 123 |

Example A2

Next, in a configuration including a glass substrate, Ta (3 nm), NiFe (6 nm), Cu (2.7 nm), CoFe (2 nm), NiFe (1 nm), a magnetization-fixing layer, and Ta (3 nm), a superlattice of Ni50Mn50 and Fe50Mn50 was used for the magnetization-fixing layer. The NiMn layer was formed to be in contact with the fixed magnetic layer. The magnetization-fixing layer was set to have an entire film thickness of 30 nm. The NiMn layer and the FeMn layer were set to have a total film thickness of 3 nm. Table 5 shows an exchange interaction magnetic field according to a change of the NiMn film thickness ratio=(NiMn layer thickness)/(total thickness of NiMn layer and FeMn layer). Table 6 shows a magnetization-enabled temperature according to the change of the NiMn film thickness ratio. The exchange interaction magnetic field and the magnetization-enabled temperature were increased almost continuously as the NiMn film thickness ratio increased. Table 7 and Table 8 show the exchange interaction magnetic field and the magnetization-enabled temperature, respectively, when the NiMn film thickness ratio was fixed to 0.5 while changing the total thickness of the NiMn layer and the FeMn layer. The exchange interaction magnetic field and the magnetization-enabled temperature were almost constant when the total film thickness was 5 nm or below, but the temperature increased, exhibiting values near to the values of a single-layered FeMn when the total thickness exceeded 5 nm. It is considered that as the film thickness per layer increases, the affect from the FeMn layer in a direct contact with the fixed layer also increases.

TABLE 5

NiMn film thickness ratio in relation to
the exchange interaction magnetic field
NiMn film thickness ratio = (NiMn layer
thickness)/(total thickness of NiMn layer and FeMn layer)

| NiMn film thickness ratio | Exchange interaction magnetic field (Oe) |
|---|---|
| 0 | 420 |
| 0.3 | 520 |
| 0.5 | 590 |
| 0.7 | 600 |
| 1 | 660 |

TABLE 6

NiMn film thickness ratio in relation to
magnetization-enabled temperature

| NiMn film thickness ratio | Magnetization-enabled temperature (° C.) |
|---|---|
| 0 | 120 |
| 0.3 | 152 |
| 0.5 | 168 |
| 0.7 | 192 |
| 1 | 220 |

TABLE 7

Total film thickness in relation to
Exchange interaction magnetic field.
Total film thickness = Total of NiMn layer and FeMn layer

| Total film thickness (nm) | Exchange interaction magnetic field (Oe) |
|---|---|
| 0.2 | 550 |
| 0.3 | 540 |
| 0.5 | 560 |
| 0.7 | 590 |
| 0.8 | 610 |
| 1 | 660 |

TABLE 8

Total film thickness in relation to
Magnetization-enabled temperature

| Total film thickness (nm) | Magnetization-enabled temperature (° C.) |
|---|---|
| 0.2 | 172 |
| 0.3 | 171 |
| 0.5 | 171 |
| 0.7 | 188 |
| 0.8 | 187 |
| 1 | 220 |

Example A3

Next, in a configuration including a glass substrate, Ta (3 nm), NiFe (6 nm), Cu (2.7 nm), CoFe (2 10 nm), NiFe (1 nm), a magnetization-fixing layer, and Ta (3 nm), superlattice of Ni50Mn50 and Pt50Mn50 was used for the magnetization-fixing layer. The NiMn layer was formed to be in contact with the fixed magnetic layer. The magnetization-fixing layer was set to have an entire film thickness of 30 nm. The NiMn layer and the PtMn layer were set to have a total film thickness of 3 nm. Table 9 shows an exchange interaction magnetic field according to a change of the NiMn film thickness ratio=(NiMn layer thickness)/(total thickness of NiMn layer and PtMn layer). Table 10 shows a magnetization-enabled temperature according to the change of the NiMn film thickness ratio. The exchange interaction magnetic field and the magnetization-enabled temperature were increased almost continuously as the NiMn film thickness ratio increased.

TABLE 9

NiMn film thickness ratio in relation to
the exchange interaction magnetic field
NiMn film thickness ratio = (NiMn layer
thickness)/(total thickness of NiMn layer and PtMn layer)

| NiMn film thickness ratio | Exchange interaction magnetic field (Oe) |
|---|---|
| 0 | 520 |
| 0.3 | 580 |
| 0.5 | 580 |
| 0.7 | 630 |
| 1 | 660 |

TABLE 10

NiMn film thickness ratio in relation to
magnetization-enabled temperature

| NiMn film thickness ratio | Magnetization-enabled temperature (° C.) |
|---|---|
| 0 | 190 |
| 0.3 | 201 |
| 0.5 | 203 |
| 0.7 | 202 |
| 1 | 220 |

Example A4

Next, in a configuration including a glass substrate, Ta (3 nm), NiFe (6 nm), Cu (2.7 nm), CoFe (2 nm), NiFe (1 nm), a magnetization-fixing layer, and Ta (3 nm), superlattice of Ni50Mn50 and Tb28Co72 was used for the magnetization-fixing layer. The NiMn layer was formed to be in contact with the fixed magnetic layer. The magnetization-fixing layer was set to have an entire film thickness of 30 nm. The NiMn layer and the TbCo layer were set to have a total film thickness of 3 nm. Table 11 shows an exchange interaction magnetic field according to a change of the NiMn film thickness ratio=(NiMn layer thickness)/(total thickness of NiMn layer and TbCo layer). Table 12 shows a magnetization-enabled temperature according to the change of the NiMn film thickness ratio. The exchange interaction magnetic field and the magnetization-enabled temperature were increased almost continuously as the NiMn film thickness ratio increased.

TABLE 11

NiMn film thickness ratio in relation to
the exchange interaction magnetic field
NiMn film thickness ratio = (NiMn layer
thickness)/(total thickness of NiMn layer and TbCo layer)

| NiMn film thickness ratio | Exchange interaction magnetic field (Oe) |
|---|---|
| 0 | 480 |
| 0.3 | 550 |
| 0.5 | 580 |
| 0.7 | 630 |
| 1 | 660 |

TABLE 12

NiMn film thickness ratio in relation to
magnetization-enabled temperature

| NiMn film thickness ratio | Magnetization-enabled temperature (° C.) |
|---|---|
| 0 | 130 |
| 0.3 | 158 |
| 0.5 | 174 |
| 0.7 | 194 |
| 1 | 220 |

Example A5

Next, in a configuration including a glass substrate, Ta (3 nm), NiFe (6 nm), Cu (2.7 nm), CoFe (2 nm), NiFe (1 nm), a magnetization-fixing layer, and Ta (3 nm), superlattice of Ni50Mn50 and Tb30Fe30Co40 was used for the magnetization-fixing layer. The NiMn layer was formed to be in contact with the fixed magnetic layer. The magnetization-fixing layer was set to have an entire film thickness of 30 nm. The NiMn layer and the TbFeCo layer were set to have a total film thickness of 3 nm. Table 13 shows an exchange interaction magnetic field according to a change of the NiMn film thickness ratio=(NiMn layer thickness)/(total thickness of NiMn layer and TbFeCo layer). Table 14 shows a magnetization-enabled temperature according to the change of the NiMn film thickness ratio. The exchange interaction magnetic field and the magnetization-enabled temperature were increased almost continuously as the NiMn film thickness ratio increased.

TABLE 13

NiMn film thickness ratio in relation to
the exchange interaction magnetic field
NiMn film thickness ratio = (NiMn layer
thickness)/(total thickness of NiMn layer and TbFeCo
layer)

| NiMn film thickness ratio | Exchange interaction magnetic field (Oe) |
|---|---|
| 0 | 490 |
| 0.3 | 540 |
| 0.5 | 560 |
| 0.7 | 600 |
| 1 | 660 |

TABLE 14

NiMn film thickness ratio in relation to
magnetization-enabled temperature

| NiMn film thickness ratio | Magnetization-enabled temperature (° C.) |
|---|---|
| 0 | 130 |
| 0.3 | 149 |
| 0.5 | 174 |
| 0.7 | 180 |
| 1 | 220 |

Example A6

Next, in a configuration including a glass substrate, Ta (3 nm), NiFe (6 nm), Cu (2.7 nm), CoFe (2 nm), NiFe (1 nm), a magnetization-fixing layer, and Ta (3 nm), superlattice of Ni50Mn50 and Ir20Mn80 was used for the magnetization-fixing layer. The NiMn layer was formed to be in contact with the fixed magnetic layer. The magnetization-fixing layer was set to have an entire film thickness of 30 nm. The NiMn layer and the IrMn layer were set to have a total film thickness of 3 nm. Table 15 shows an exchange interaction magnetic field according to a change of the NiMn film thickness ratio=(NiMn layer thickness)/(total thickness of NiMn layer and IrMn layer). Table 16 shows a magnetization-enabled temperature according to the change of the NiMn film thickness ratio. The exchange interaction magnetic field and the magnetization-enabled temperature were increased almost continuously as the NiMn film thickness ratio increased.

TABLE 15

NiMn film thickness ratio in relation to
the exchange interaction magnetic field
NiMn film thickness ratio = (NiMn layer
thickness)/(total thickness of NiMn layer and IrMn layer)

| NiMn film thickness ratio | Exchange interaction magnetic field (Oe) |
|---|---|
| 0 | 460 |
| 0.3 | 530 |
| 0.5 | 550 |
| 0.7 | 600 |
| 1 | 660 |

TABLE 16

NiMn film thickness ratio in relation to
magnetization-enabled temperature

| NiMn film thickness ratio | Magnetization-enabled temperature (° C.) |
|---|---|
| 0 | 170 |
| 0.3 | 186 |
| 0.5 | 191 |
| 0.7 | 201 |
| 1 | 220 |

Example A7

Next, in a configuration including a glass substrate, Ta (3 nm), NiFe (6 nm), Cu (2.7 nm), CoFe (2 nm), NiFe (1 nm), a magnetization-fixing layer, and Ta (3 nm), superlattice of Pt50Mn50 and Fe50Mn50 was used for the magnetization-fixing layer. The PtMn layer was formed to be in contact with the fixed magnetic layer. The magnetization-fixing layer was set to have an entire film thickness of 30 nm. The PtMn layer and the FeMn layer were set to have a total film thickness of 3 nm. Table 17 shows an exchange interaction magnetic field according to a change of the PtMn film thickness ratio=(PtMn layer thickness)/(total thickness of PtMn layer and FeMn layer). Table 18 shows a magnetization-enabled temperature according to the change of the PtMn film thickness ratio. The exchange interaction magnetic field and the magnetization-enabled temperature were increased almost continuously as the PtMn film thickness ratio increased.

TABLE 17

PtMn film thickness ratio in relation to
the exchange interaction magnetic field
PtMn film thickness ratio = (PtMn layer
thickness)/(total thickness of PtMn layer and FeMn layer)

| PtMn film thickness ratio | Exchange interaction magnetic field (Oe) |
|---|---|
| 0 | 430 |
| 0.3 | 460 |
| 0.5 | 470 |
| 0.7 | 500 |
| 1 | 530 |

TABLE 18

PtMn film thickness ratio in relation to
magnetization-enabled temperature

| PtMn film thickness ratio | Magnetization-enabled temperature (° C.) |
|---|---|
| 0 | 120 |
| 0.3 | 137 |
| 0.5 | 151 |
| 0.7 | 168 |
| 1 | 190 |

Example A8

Next, in a configuration including a glass substrate, Ta (3 nm), NiFe (6 nm), Cu (2.7 nm), CoFe (2 nm), NiFe (1 nm), a magnetization-fixing layer, and Ta (3 nm), superlattice of Pt50Mn50 and Tb28Co72 was used for the magnetization-fixing layer. The PtMn layer was formed to be in contact with the fixed magnetic layer. The magnetization-fixing layer was set to have an entire film thickness of 30 nm. The PtMn layer and the TbCo layer were set to have a total film thickness of 3 nm. Table 19 shows an exchange interaction magnetic field according to a change of the PtMn film thickness ratio=(PtMn layer thickness)/(total thickness of PtMn layer and TbCo layer). Table 20 shows a magnetization-enabled temperature according to the change of the PtMn film thickness ratio. The exchange interaction magnetic field and the magnetization-enabled temperature were increased almost continuously as the PtMn film thickness ratio increased.

TABLE 19

PtMn film thickness ratio in relation to
the exchange interaction magnetic field
PtMn film thickness ratio = (PtMn layer
thickness)/(total thickness of PtMn layer and TbCo layer)

| PtMn film thickness ratio | Exchange interaction magnetic field (Oe) |
|---|---|
| 0 | 480 |
| 0.3 | 500 |
| 0.5 | 500 |
| 0.7 | 500 |
| 1 | 520 |

TABLE 20

PtMn film thickness ratio in relation to
magnetization-enabled temperature

| PtMn film thickness ratio | Magnetization-enabled temperature (° C.) |
|---|---|
| 0 | 130 |
| 0.3 | 147 |
| 0.5 | 164 |
| 0.7 | 169 |
| 1 | 190 |

Example A9

Next, in a configuration including a glass substrate, Ta (3 nm), NiFe (6 nm), Cu (2.7 nm), CoFe (2 nm), NiFe (1 nm), a magnetization-fixing layer, and Ta (3 nm), superlattice of Pt50Mn50 and Tb30Fe30Co40 was used for the magnetization-fixing layer. The PtMn layer was formed to be in contact with the fixed magnetic layer. The magnetization-fixing layer was set to have an entire film thickness of 30 nm. The PtMn layer and the TbFeCo layer were set to have a total film thickness of 3 nm. Table 21 shows an exchange interaction magnetic field according to a change of the PtMn film thickness ratio=(PtMn layer thickness)/(total thickness of PtMn layer and TbFeCo layer). Table 22 shows a magnetization-enabled temperature according to the change of the PtMn film thickness ratio. The exchange interaction magnetic field and the magnetization-enabled temperature were increased almost continuously as the PtMn film thickness ratio increased.

TABLE 21

PtMn film thickness ratio in relation to
the exchange interaction magnetic field
PtMn film thickness ratio = (PtMn layer
thickness)/(total thickness of PtMn layer and TbFeCo layer)

| PtMn film thickness ratio | Exchange interaction magnetic field (Oe) |
|---|---|
| 0 | 490 |
| 0.3 | 500 |
| 0.5 | 510 |
| 0.7 | 510 |
| 1 | 520 |

TABLE 22

PtMn film thickness ratio in relation to
magnetization-enabled temperature

| PtMn film thickness ratio | Magnetization-enabled temperature (° C.) |
|---|---|
| 0 | 130 |
| 0.3 | 146 |
| 0.5 | 157 |
| 0.7 | 169 |
| 1 | 190 |

Example A10

Next, configuration including a glass substrate, Ta (3 nm), NiFe (6 nm), Cu (2.7 nm), CoFe (2 nm), NiFe (1 nm), a magnetization-fixing layer, and Ta (3 nm), superlattice of Ir20Mn80 and Fe50Mn50 was used for the magnetization-fixing layer. The IrMn layer was formed to be in contact with the fixed magnetic layer. The magnetization-fixing layer was set to have an entire film thickness of 30 nm. The IrMn layer and the FeMn layer were set to have a total film thickness of 3 nm. Table 23 shows an exchange interaction magnetic field according to a change of the IrMn film thickness ratio=(IrMn layer thickness)/(total thickness of IrMn layer and FeMn layer). Table 24 shows a magnetization-enabled temperature according to the change of the IrMn film thickness ratio. The exchange interaction magnetic field and the magnetization-enabled temperature were increased almost continuously as the IrMn film thickness ratio increased.

TABLE 23

IrMn film thickness ratio in relation to
the exchange interaction magnetic field
IrMn film thickness ratio = (IrMn layer
thickness)/(total thickness of IrMn layer and FeMn layer)

| IrMn film thickness ratio | Exchange interaction magnetic field (Oe) |
|---|---|
| 0 | 430 |
| 0.3 | 450 |
| 0.5 | 460 |
| 0.7 | 450 |
| 1 | 460 |

TABLE 24

IrMn film thickness ratio in relation to
magnetization-enabled temperature

| IrMn film thickness ratio | Magnetization-enabled temperature (° C.) |
|---|---|
| 0 | 120 |
| 0.3 | 134 |
| 0.5 | 143 |
| 0.7 | 150 |
| 1 | 170 |

Example A11

Next, in a configuration including a glass substrate, Ta (3 nm), NiFe (6 nm), Cu (2.7 nm), CoFe (2 nm), NiFe (1 nm), a magnetization-fixing layer, and Ta (3 nm), superlattice of Ir20Mn80 and Tb28Co72 was used for the magnetization-fixing layer. The IrMn layer was formed to be in contact with the fixed magnetic layer. The magnetization-fixing layer was set to have an entire film thickness of 30 nm. The IrMn layer and the TbCo layer were set to have a total film thickness of 3 nm. Table 25 shows an exchange interaction magnetic field according to a change of the IrMn film thickness ratio=(IrMn layer thickness)/(total thickness of TbCo layer and FeMn layer). Table 26 shows a magnetization-enabled temperature according to the change of the IrMn film thickness ratio. The exchange interaction magnetic field and the magnetization-enabled temperature were increased almost continuously as the IrMn film thickness ratio increased.

TABLE 25

IrMn film thickness ratio in relation to
the exchange interaction magnetic field
IrMn film thickness ratio = (IrMn layer
thickness)/(total thickness of IrMn layer and TbCo layer)

| IrMn film thickness ratio | Exchange interaction magnetic field (Oe) |
|---|---|
| 0 | 480 |
| 0.3 | 470 |
| 0.5 | 470 |
| 0.7 | 460 |
| 1 | 460 |

TABLE 26

IrMn film thickness ratio in relation to
magnetization-enabled temperature

| IrMn film thickness ratio | Magnetization-enabled temperature (° C.) |
|---|---|
| 0 | 130 |
| 0.3 | 144 |
| 0.5 | 152 |
| 0.7 | 156 |
| 1 | 170 |

Example A12

Next, in a configuration including a glass substrate, Ta (3 nm), NiFe (6 nm), Cu (2.7 nm), CoFe (2 nm), NiFe (1 nm), a magnetization-fixing layer, and Ta (3 nm), superlattice of Ir20Mn80 and Tb30Fe30Co40 was used for the magnetization-fixing layer. The IrMn layer was formed to be in contact with the fixed magnetic layer. The magnetization-fixing layer was set to have an entire film thickness of 30 nm. The IrMn layer and the TbFeCo layer were set to have a total film thickness of 3 nm. Table 27 shows an exchange interaction magnetic field according to a change of the IrMn film thickness ratio=(IrMn layer thickness)/(total thickness of TbFeCo layer and FeMn layer). Table 28 shows a magnetization-enabled temperature according to the change of the IrMn film thickness ratio. The exchange interaction magnetic field and the magnetization-enabled temperature were increased almost continuously as the IrMn film thickness ratio increased.

TABLE 27

IrMn film thickness ratio in relation to
the exchange interaction magnetic field
IrMn film thickness ratio = (IrMn layer
thickness)/(total thickness of IrMn layer and TbFeCo layer)

| IrMn film thickness ratio | Exchange interaction magnetic field (Oe) |
|---|---|
| 0 | 490 |
| 0.3 | 480 |
| 0.5 | 480 |
| 0.7 | 480 |
| 1 | 460 |

TABLE 28

IrMn film thickness ratio in relation to
magnetization-enabled temperature

| IrMn film thickness ratio | Magnetization-enabled temperature (° C.) |
|---|---|
| 0 | 130 |
| 0.3 | 142 |
| 0.5 | 147 |
| 0.7 | 153 |
| 1 | 170 |

Next, the aforementioned magneto-resistance effect elements thus prepared were applied to a shield-type MR sensor of FIG. 2 and FIG. 3.

Example B1

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Ni46Mn54 and Fe50Mn50. In the superlattice, each NiMn layer had a film thickness of 1.5 nm and each FeMn layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 154 kFCI. The reproduction output (peak to peak) was 1.7 mV. The S/N ratio was 27 dB. The error rate was $10^{-6}$ or below. No noise was observed. A preferable waveform was obtained. The error rate remained unchanged after the environment test of 80 degrees C., 500 Oe for 2500 hours. The current conduction test with current density of $2 \times 107$ A/cm$^2$ under an ambient temperature of 80 degrees C. resulted in no change in the resistance value as well as in the resistance change ratio up to 1000 hours.

Example B2

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Ni46Mn54 and Pt50Mn50. In the superlattice, each NiMn layer had a film thickness of 1.5 nm and each PtMn layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 160 kFCI. The reproduction output (peak to peak) was 1.6 mV. The S/N ratio was 26.8 dB. The error rate was $10^{-6}$ or below. No noise was observed. A preferable waveform was obtained. The error rate remained unchanged after an environment test of 80 degrees C., 500 Oe for 2500 hours. The current conduction test with current density of $2 \times 107$ A/cm$^2$ under an ambient temperature of 80 degrees C. resulted in no change in the resistance value as well as in the resistance change ratio up to 1000 hours.

Example B3

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Ni46Mn54 and Tb28Co72. In the superlattice, each NiMn layer had a film thickness of 1.5 nm and each TbCo layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 157 kFCI. The reproduction output (peak to peak) was 1.55 mV. The S/N ratio was 26.4 dB. The error rate was $10^{-6}$ or below. No noise was observed. A preferable waveform was obtained. The error rate remained unchanged after an environment test of 80 degrees C., 500 Oe for 2500 hours. The current conduction test with current density of $2 \times 107$ A/cm$^2$ under an ambient temperature of 80 degrees C. resulted in no change in the resistance value as well as in the resistance change ratio up to 1000 hours.

Example B4

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Ni46Mn54 and Tb30Fe30Co40. In the superlattice, each NiMn layer had a film thickness of 1.5 nm and each TbFeCo layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 155 kFCI. The reproduction output (peak to peak) was 1.58 mV. The S/N ratio was 26.3 dB. The error rate was $10^{-6}$ or below. No noise was observed. A preferable waveform was obtained. The error rate remained unchanged after an environment test of 80 degrees C., 500 Oe for 2500 hours. The current conduction test with current density of $2 \times 107 \, A/cm^2$ under an ambient temperature of 80 degrees C. resulted in no change in the resistance value as well as in the resistance change ratio up to 1000 hours.

Example B5

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Ni46Mn54 and Ir20Mn80. In the superlattice, each NiMn layer had a film thickness of 1.5 nm and each IrMn layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 158 kFCI. The reproduction output (peak to peak) was 1.75 mV. The S/N ratio was 26 dB. The error rate was $10^{-6}$ or below. No noise was observed. A preferable waveform was obtained. The error rate remained unchanged after an environment test of 80 degrees C., 500 Oe for 2500 hours. The current conduction test with current density of $2 \times 107 \, A/cm^2$ under an ambient temperature of 80 degrees C. resulted in no change in the resistance value as well as in the resistance change ratio up to 1000 hours.

Example B6

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Pt50Mn50 and Fe50Mn50. In the superlattice, each PtMn layer had a film thickness of 1.5 nm and each FeMn layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 165 kFCI. The reproduction output (peak to peak) was 1.78 mV. The S/N ratio was 27.7 dB. The error rate was $10^{-6}$ or below. No noise was observed. A preferable waveform was obtained. The error rate remained unchanged after an environment test of 80 degrees C., 500 Oe for 2500 hours. The current conduction test with current density of 2×107 A/cm² under an ambient temperature of 80 degrees C. resulted in no change in the resistance value as well as in the resistance change ratio up to 1000 hours.

Example B7

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Pt50Mn50 and Tb28Co72. In the superlattice, each PtMn layer had a film thickness of 1.5 nm and each TbCo layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 167 kFCI. The reproduction output (peak to peak) was 1.77 mV. The S/N ratio was 27.9 dB. The error rate was 10⁻⁶ or below. No noise was observed. A preferable waveform was obtained. The error rate remained unchanged after an environment test of 80 degrees C., 500 Oe for 2500 hours. The current conduction test with current density of 2×107 A/cm² under an ambient temperature of 80 degrees C. resulted in no change in the resistance value as well as in the resistance change ratio up to 1000 hours.

Example B8

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Pt50Mn50 and Tb30Fe30Co40. In the superlattice, each PtMn layer had a film thickness of 1.5 nm and each TbFeCo layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 164 kFCI. The reproduction output (peak to peak) was 1.73 mV. The S/N ratio was 27.2 dB. The error rate was 10⁻⁶ or below. No noise was observed. A preferable waveform was obtained. The error rate remained unchanged after an environment test of 80 degrees C., 500 Oe for 2500 hours. The current conduction test with current density of 2×107 A/cm² under an ambient temperature of 80 degrees C. resulted in no change in the resistance value as well as in the resistance change ratio up to 1000 hours.

Example B9

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Ir20Mn80 and Fe50Mn50. In the superlattice, each IrMn layer had a film thickness of 1.5 nm and each FeMn layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 160 kFCI. The reproduction output (peak to peak) was 1.70 mV. The S/N ratio was 27.1 dB. The error rate was $10^{-6}$ or below. No noise was observed. A preferable waveform was obtained.

Example B10

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Ir20Mn80 and Tb28Co72. In the superlattice, each IrMn layer had a film thickness of 1.5 nm and each TbCo layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 158 kFCI. The reproduction output (peak to peak) was 1.71 mV. The S/N ratio was 26.8 dB. The error rate was $10^{-6}$ or below. No noise was observed. A preferable waveform was obtained.

Example B11

A head was prepared using the magneto-resistance effect elements in the shield type MR sensor of FIG. 2 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Ir20Mn80 and Tb30Fe30Co40. In the superlattice, each IrMn layer had a film thickness of 1.5 nm and each TbFeCo layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 156 kFCI. The reproduction output (peak to peak) was 1.62 mV. The S/N ratio was 26.5 dB. The error rate was $10^{-6}$ or below. No noise was observed. A preferable waveform was obtained.

Example B12

A head was prepared using the magneto-resistance effect elements in the shield type MR sensor of FIG. 3 with a lower shield layer of NiFe and a lower gap layer of alumina. The magneto-resistance effect element actually used was constituted by layers of Ta (3 nm), Ni82Fe18 (4 nm), Cu (2.7 nm), Co90Fe10 (2 nm), Ni82Fe18 (1 nm), a magnetization-fixing layer (30 nm), and Ta (3 nm). This was processed by way of photo-resist processing into a size of 1×1 micrometer. The magnetization-fixing layer was a superlattice of Ni46Mn54 and Tb28Co72. In the superlattice, each NiMn layer had a film thickness of 1.5 nm and each TbCo layer had a film thickness of 1.5 nm. After a patterned film was formed, CoCrPt and Mo lower electrode were layered so as to be adjacent to the end of the patterned film. The upper gap layer was formed from alumina and the upper shield layer was formed from NiFe.

This head was processed into a unitary recording/reproduction head as shown in FIG. 4 with a slider processing. A data was recorded and reproduced onto/from a recording medium containing CoCrTa as a main content, with a write-in track width of 1.5 micrometers, a write-in gap of 0.2 micrometers, a read-in track width of 1.0 micrometers, and read-in gap of 0.21 micrometers. The write head block had a coil portion prepared by a photo-resist hardening step at 250 degrees C. for 2 hours. This step caused to rotate the magnetization direction (which should have been in the element height direction) of the fixed layer and the magnetization direction of the magnetization-fixing layer, disabling to operate correctly as a spin bulb. To cope with this, after formation of the reproduction head block and the recording head block, they were subjected to a magnetization thermal treatment at 200 degrees in a magnetic field of 500 Oe for 1 hour. According to the magnetization curve, this magnetization thermal treatment caused almost no rotation of the axis of easy magnetization of the free magnetic layer into the magnetization direction. The coercive force of the medium was set to 2.5 kOe.

A reproduction output was determined with a record mark length changed. This test brought about preferable results as follows. The mark length decreasing the reproduction output to half was 157 kFCI. The reproduction output (peak to peak) was 1.64 mV. The S/N ratio was 26.9 dB. The error rate was $10^{-6}$ or below. No noise was observed. A preferable waveform was obtained. The error rate remained unchanged after an environment test of 80 degrees C., 500 Oe for 2500 hours. The current conduction test with current density of $2 \times 107$ A/cm$^2$ under an ambient temperature of 80 degrees C. resulted in no change in the resistance value as well as in the resistance change ratio up to 1000 hours.

Next, explanation will be given on a magnetic disc apparatus produced according to the present invention. The magnetic disc apparatus has three discs on a base. On the rear surface of the base, there are provided a head drive circuit, a signal processing circuit, and an I/O interface. The magnetic disc apparatus is connected to an external device with a 32-bit bus line. Six heads are provided on both sides of the magnetic discs. The magnetic disc apparatus further comprises a rotary actuator for driving the heads, and its drive and control circuits, and a motor directly connected to a disc rotation spindle. The disc has a diameter of 46 mm and a data plane in a range from diameter 10 mm to diameter 40 mm. An embedded type servo method is employed having no servo surface, which enables to obtain a high recording density.

This magnetic disc apparatus can be directly connected as an external storage apparatus of a small-size computer. The I/O interface includes a cache memory corresponding to a bus line having a transfer rate in a range o of 5 to 20 M bytes per second. Moreover, it is possible to constitute a large-capacity magnetic disc apparatus by providing an external controller to connect a plurality of the magnetic disc apparatuses.

The present invention enables to freely change the temperature at which the magnetization direction of the magnetization-fixing layer in the magneto-resistance effect element can be aligned in a single direction. This enables to change the magnetization temperature of the magnetization-fixing layer after preparation of the recording/reproduction head. As a result, it has become possible to suppress a damage of the free magnetic layer in the axis of easy magnetization due to magnetization, enabling to obtain a magneto-resistance effect element, magneto-resistance effect sensor, magneto-resistance detecting system, and a magnetic storage system having an excellent recording/reproduction characteristic with little noise and a high environment resistance.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 09-330499 (Filed on December $1^{st}$, 1997) including specification, claims, drawings and summary are incorporated herein by reference in its entirety.

What is claimed is:

1. A magneto-resistance (MR) effect element comprising a basic layered configuration including:
   a free magnetic layer;
   a non-magnetic layer;
   a fixed magnetic layer; and
   a magnetization-fixing layer made from a superlattice consisting of at least two different materials for fixing magnetization of said fixed magnetic layer, and magnetization-fixing layer having plural layers that include a ferrimagnetic layer.

2. A magneto-resistance effect element as claimed in claim 1, wherein said magnetization-fixing layer comprises plural ferrimagnetic layers.

3. A magneto-resistance effect element as claimed in claim 1, wherein said magnetization-fixing layer comprises a combination of a metal antiferromagnetic layer and the ferrimagnetic layer.

4. A magneto-resistance (MR) effect element production method for producing an MR effect element comprising a basic layered configuration including: a free magnetic layer; a non-magnetic layer; a fixed magnetic layer; and a magnetization-fixing layer for fixing magnetization of said fixed magnetic layer, said magnetization-fixing layer being a superlattice consisting of at least two materials, said magnetization-fixing layer having plural layers that include a ferrimagnetic layer,
   wherein each of said materials is formed in a layer having a thickness controlled so as to adjust a temperature causing rotation of a magnetization direction of said magnetization-fixing layer.

5. A magneto-resistance (MR) effect element production method as claimed in claim 4, wherein said magnetization-fixing layer further comprises a metal antiferromagnetic layer.

6. A shield-type magneto-resistance (MR) effect sensor comprising:
   a substrate;
   a patterned lower shield layer formed on said substrate;
   a lower gap layer formed on said lower shield layer;
   a patterned magneto-resistance (MR) effect element;
   a vertical bias layer formed adjacent to ends of said MR effect element;
   a lower electrode layer formed on said vertical bias layer;
   an upper gap layer formed on said lower electrode layer, and
   an upper shield layer formed on said upper gap layer,
   said MR effect element having a basic layered configuration including: a free magnetic layer; a non-magnetic layer; a fixed magnetic layer; and a magnetization-fixing layer as a superlattice consisting of at least two materials, said magnetization-fixing layer having plural layers that include a ferrimagnetic layer, wherein each of said materials is formed in a layer having a thickness controlled so as to adjust a temperature causing rotation of a magnetization direction of said magnetization-fixing layer.

7. A shield-type magneto-resistance (MR) effect sensor as claimed in claim 6, wherein said magnetization-fixing layer further comprises a metal antiferromagnetic layer.

8. A shield-type magneto-resistance (MR) effect sensor comprising:

a substrate;

a patterned lower shield layer formed on said substrate;

a lower gap layer formed on said lower shield layer;

a patterned magneto-resistance (MR) effect element;

a vertical bias layer formed so as to partially cover said MR effect element;

a lower electrode layer formed on said vertical bias layer;

an upper gap layer formed on said lower electrode layer, and an upper shield layer formed on said upper gap layer, said MR effect element having a basic layered configuration including: a free magnetic layer; a non-magnetic layer; a fixed magnetic layer; and a magnetization-fixing layer as a superlattice consisting of at least two materials, said magnetization-fixing layer having plural layers that include a ferrimagnetic layer, each of which is formed in a layer having a thickness controlled so as to adjust a temperature causing rotation of a magnetization direction of said magnetization-fixing layer.

9. A shield-type magneto-resistance (MR) effect sensor comprising as claimed in claim 8, wherein said magnetization-fixing layer further comprises a metal ferromagnetic layer.

10. A magneto-resistance (MR) detection system comprising:

a magneto-resistance (MR) effect sensor;

a power source for generating a current flowing in said magneto-resistance sensor; and a magneto-resistance change sensor for detecting a change in magneto-resistance of said magneto-resistance sensor as a function of a magnetic field detected, said MR effect sensor comprising: a substrate; a patterned lower shield layer; a lower gap layer; a patterned magneto-resistance (MR) effect element having a basic layered configuration including a free magnetic layer, a non-magnetic layer, a fixed magnetic layer, and a magnetization-fixing layer as a superlattice consisting of at least two materials, each of which is formed in a layer having a thickness controlled so as to adjust a temperature causing rotation of a magnetization direction of said magnetization-fixing layer, said magnetization-fixing layer having plural layers that include a ferrimagnetic layer; a vertical bias layer formed adjacent to ends of said MR effect element; a lower electrode layer formed on said vertical bias layer; an upper gap layer; and an upper shield layer.

11. A magneto-resistance (MR) detection system comprising:

a magneto-resistance (MR) effect sensor;

a power source for generating a current flowing in said magneto-resistance sensor; and a magneto-resistance change sensor for detecting a change in magneto-resistance of said magneto-resistance sensor as a function of a magnetic field detected, said magneto-resistance effect sensor comprising: a substrate; a patterned lower shield layer; a lower gap layer; a patterned magneto-resistance effect element having a basic layered configuration including a free magnetic layer, a non-magnetic layer, a fixed magnetic layer, and a magnetization-fixing layer as a superlattice consisting of at least two materials, each of which is formed in a layer having a thickness controlled so as to adjust a temperature causing rotation of a magnetization direction of said magnetization-fixing layer, said magnetization-fixing layer having plural layers that include a ferrimagnetic layer; a vertical bias layer formed to partially cover said MR effect element; a lower electrode layer formed on said vertical bias layer; an upper gap layer; and an upper shield layer.

12. A magnetic storage system comprising:

a magnetic storage medium having a plurality of tracks for recording a data;

a magnetic recording system for storing a data on a magnetic recording medium;

a magneto-resistance detecting system having a magneto-resistance effect sensor, a power source for generating a current flowing in said magneto-resistance sensor, and a magneto-resistance ratio change detecting sensor; and an actuator for moving said magnetic recording system and said magneto-resistance detecting system to a track selected on said magnetic storage medium, wherein said magneto-resistance effect element includes a free magnetic layer, a non-magnetic layer, a fixed magnetic layer, and a magnetization-fixing made from a superlattice consisting of at least two materials, said magnetization-fixing layer having plural layers that include a ferrimagnetic layer.

* * * * *